United States Patent
Wang et al.

(10) Patent No.: US 8,809,179 B2
(45) Date of Patent: Aug. 19, 2014

(54) METHOD FOR REDUCING TOPOGRAPHY OF NON-VOLATILE MEMORY AND RESULTING MEMORY CELLS

(75) Inventors: Shih Wei Wang, Hsin-Chu (TW); Derek Lin, Hsin Chu (TW); Chen-Ming Huang, Hsin-Chu (TW); Chang-Jen Hsieh, Hsin-Chu (TW); Chi-Hsin Lo, Zhubei (TW); Chung-Yi Yu, Hsin-Chu (TW); Feng-Jia Shiu, Hsin-Chu (TW); Yeur-Luen Tu, Zhubei (TW); Yi-Shin Chu, Hsin-Chu (TW); Jen-Sheng Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1116 days.

(21) Appl. No.: 11/716,164

(22) Filed: Mar. 9, 2007

(65) Prior Publication Data

US 2007/0241386 A1    Oct. 18, 2007

Related U.S. Application Data

(60) Provisional application No. 60/791,728, filed on Apr. 13, 2006.

(51) Int. Cl.
*H01L 21/44*    (2006.01)
*H01L 27/115*    (2006.01)
*H01L 27/105*    (2006.01)

(52) U.S. Cl.
CPC ........ *H01L 27/11568* (2013.01); *H01L 27/105* (2013.01); *H01L 27/11573* (2013.01); *H01L 27/11521* (2013.01); *H01L 27/11526* (2013.01)
USPC .................................... 438/597; 257/E27.078

(58) Field of Classification Search
USPC ......... 438/597, 255–266, 201, 288, 573, 652; 257/314–326, E27.078, E29.3
See application file for complete search history.

(56) References Cited

U.S. PATENT DOCUMENTS

| | | | |
|---|---|---|---|
| 6,320,217 B1 * | 11/2001 | Tagami et al. | ................ 257/315 |
| 6,674,118 B2 | 1/2004 | Yeh et al. | |
| 6,713,811 B2 | 3/2004 | Hsieh | |
| 6,787,418 B2 | 9/2004 | Chu et al. | |
| 6,881,629 B2 | 4/2005 | Hsieh et al. | |
| 6,982,458 B2 | 1/2006 | Chu et al. | |
| 2003/0142550 A1 * | 7/2003 | Kawahara et al. | ....... 365/185.28 |
| 2005/0085038 A1 | 4/2005 | Tu | |
| 2006/0118857 A1 * | 6/2006 | Jeong | ............................ 257/316 |

* cited by examiner

*Primary Examiner* — Shaun Campbell
(74) *Attorney, Agent, or Firm* — Slater and Matsil, L.L.P.

(57) ABSTRACT

A method for forming a semiconductor structure includes providing a substrate; forming a gate stack of a flash memory cell, wherein a top portion of the gate stack comprises a capping layer; forming a gate having at least a portion over the capping layer; and reducing a thickness of the portion of the gate over the capping layer. The topography height difference between the flash memory cell and MOS devices on the same chip is reduced.

20 Claims, 11 Drawing Sheets

METHOD FOR REDUCING TOPOGRAPHY OF NON-VOLATILE MEMORY AND RESULTING MEMORY CELLS

This application claims the benefit of U.S. Provisional Application No. 60/791,728, filed on Apr. 13, 2006, entitled "Method for Reducing Topography of Non-Volatile Memory and Resulting Memory Cells," which application is hereby incorporated herein by reference.

TECHNICAL FIELD

This invention relates generally to semiconductor devices, and more particularly to the structure and manufacturing methods of flash memory cells.

BACKGROUND

Flash memory has become increasingly popular in recent years. A typical flash memory comprises a memory array having a large number of memory cells arranged in blocks.

Each of the memory cells is fabricated as a field-effect transistor having a control gate and a floating gate. The floating gate is capable of holding charges and is separated from source and drain regions contained in a substrate by a layer of thin oxide. Each of the memory cells can be electrically charged by injecting electrons from the drain region through the oxide layer onto the floating gate. The charges can be removed from the floating gate by tunneling the electrons to the source through the oxide layer during an erase operation. The data in a memory cell is thus determined by the presence or absence of a charge on the floating gate.

Flash cells come in two major types: stack gate flash cells and split gate flash cells. FIG. 1 illustrates a tri-gate split gate flash cell 2, which includes a floating gate 12, a control gate 14, and a selection gate 16. Selection gate 16 is typically referred to as wordline 16, as it is commonly connected to a wordline of the memory array. The split gate flash cells exhibit an improved performance over the stacked gate flash cells. Particularly, with the access control provided by the wordline 16, over-erase can be prevented.

Flash memory cells are typically formed along with other circuits (non-memory circuits), such as core circuits. An exemplary MOS device 18 in non-memory circuits is also shown in FIG. 1. Since flash memory cells typically have more layers, the height of the flash memory cells are typically greater than the height of non-memory MOS devices, and thus a topography height difference TH appears. For great-scale integrated circuit formation technologies, such as 130 nm and higher, the topography height difference can be overcome, although process-difficulty still occurs. For small-scale integrated circuit formation technologies, such as 90 nm and lower, the topography height difference is hard to overcome. This problem can be explained using 45 nm technology as an example. At this scale, the topography height difference TH may be as high as 2000 Å. The depth of focus, which indicates how deep the imaging light used by lithography instruments can effectively penetrate into the photo resist, is about 1800 Å. Therefore, any process variation may cause under-exposure of the photo resist.

In addition, with the uneven wafer surface caused by the topography height difference, it is hard for a lithography instrument to measure and be aligned to the surface of the wafer.

To solve the above-discussed problems, new flash memory cell structures and/or new formation methods for forming the flash memory cell structures are needed.

SUMMARY OF THE INVENTION

In accordance with one aspect of the present invention, a semiconductor structure includes a substrate comprising a cell region and a non-cell region. A flash memory cell is formed in the cell region, wherein the flash memory cell comprises a first gate (a selection gate). A metal-oxide-semiconductor (MOS) device is formed in the non-cell region wherein the MOS device comprises a second gate. The first gate and the second gate are preferably simultaneously formed, and thus comprise the same materials. The first gate has a higher portion having a first thickness directly over a gate stack of the flash memory cell. The first thickness is substantially less than a second thickness of the second gate.

In accordance with another aspect of the present invention, a semiconductor structure includes a flash memory cell at a surface of a substrate, wherein the flash memory cell comprises a channel dielectric on the substrate; a gate stack on the substrate and adjacent the channel dielectric; and a wordline. The wordline includes a substantially flat top surface; a vertical portion on a sidewall of the gate stack; and a horizontal portion on the channel dielectric having a thickness. The top surface of the wordline and a top surface of the gate stack have a vertical distance. The vertical distance is substantially less than the thickness.

In accordance with yet another aspect of the present invention, a semiconductor structure includes a substrate comprising a cell region and a non-cell region; a flash memory cell in the cell region, wherein the flash memory cell comprises a first gate (a selection gate); a first dummy feature in the cell region and over a first insulation region wherein the first dummy feature comprises a first dummy gate; a MOS device in the non-cell region, wherein the MOS device comprises a second gate; and a second dummy feature in the non-cell region and over a second insulation region, wherein the second dummy feature comprises a second dummy gate. The first gate, the second gate, the first dummy gate, and the second dummy gate are simultaneously formed, thus comprise substantially the same materials. At least one of the first gate and first dummy gate has at least a top portion having a thickness less than a thickness of the second gate.

In accordance with yet another aspect of the present invention, a method for forming a semiconductor structure includes providing a substrate; forming a gate stack of a flash memory cell, wherein a top portion of the gate stack comprises a capping layer; forming a gate having at least a portion over the capping layer; and reducing a thickness of the portion of the gate over the capping layer.

In accordance with yet another aspect of the present invention, a method for forming a semiconductor structure includes providing a substrate comprising a cell region and a non-cell region; forming a first gate stack of a flash memory cell in the cell region wherein a top portion of the first gate stack comprises a capping layer; forming a first gate having at least a higher portion over the first capping layer; forming a gate dielectric of a MOS device in the non-cell region; forming a second gate of the MOS device on the gate dielectric, wherein the second gate is simultaneously formed with the first gate; and recessing the first gate to reduce a height difference between a top surface of the first gate and a top surface of the second gate.

The topography height difference between the flash memory cell and MOS devices on the same chip is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The cross-sectional views of the intermediate stages in the manufacture of the preferred embodiments are illustrated in FIGS. 2 through 19, wherein like reference numbers are used to designate like elements throughout the various views and illustrative embodiments of the present invention.

Figure 1:
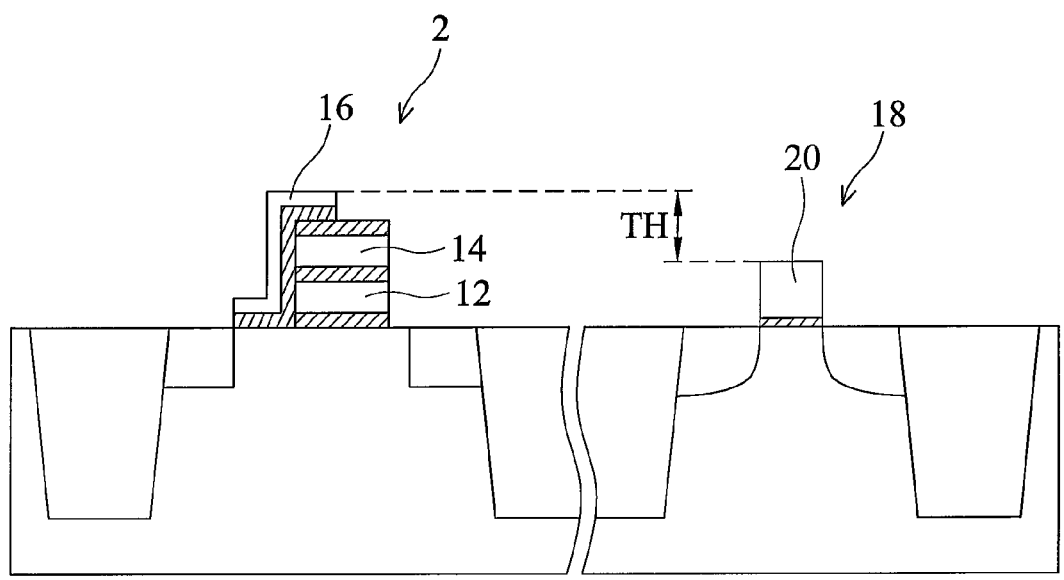
FIG. 1 illustrates a topography height difference between a flash memory cell and a MOS device in a non-memory region.
Figure 2:
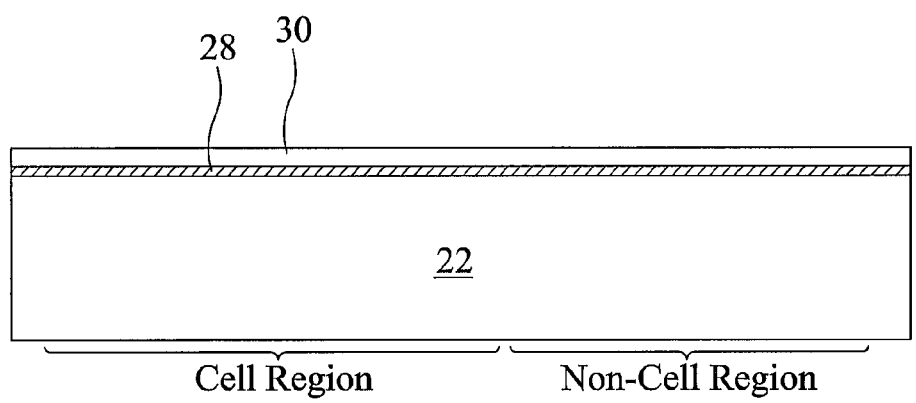
FIGS. 2 through 12 are cross-sectional views of intermediate stages in the manufacturing of a preferred embodiment.

FIGS. 2 through 6 illustrate the formation of shallow trench isolation (STI) regions. FIG. 2 illustrates a cross-sectional view of a portion of a semiconductor substrate 22. The semiconductor substrate 22 includes two regions, a cell region and a non-cell region. The cell region is for forming flash memory cells, while the non-cell region is for forming other non-memory devices, such as core devices. In the preferred embodiment, substrate 22 is a silicon substrate. In other embodiments, substrate 22 can be formed of other materials, including silicon, carbon, germanium, gallium, arsenic, nitrogen, aluminum, indium, and/or phosphorus. Substrate 22 may also be a bulk substrate or have a semiconductor-on-insulator (SOI) structure.

An optional pad layer 28 and a mask layer 30 are formed on substrate 22. Pad layer 28 is preferably a thin film formed through a thermal process. It is used to buffer substrate 22 and mask layer 30 so that less stress is generated. Pad layer 28 may also act as an etch stop layer for the subsequently formed mask layer 30. In the preferred embodiment, mask layer 30 is formed of silicon nitride using low-pressure chemical vapor deposition (LPCVD). In other embodiments, thermal nitridation of silicon, plasma enhanced chemical vapor deposition (PECVD) or plasma anodic nitridation using nitrogen-hydrogen may be used to form mask layer 30. Mask layer 30 preferably has a thickness of between about 800 Å and about 1500 Å. Pad layer 28 preferably has a thickness of between about 90 Å and about 110 Å.

Figure 3:
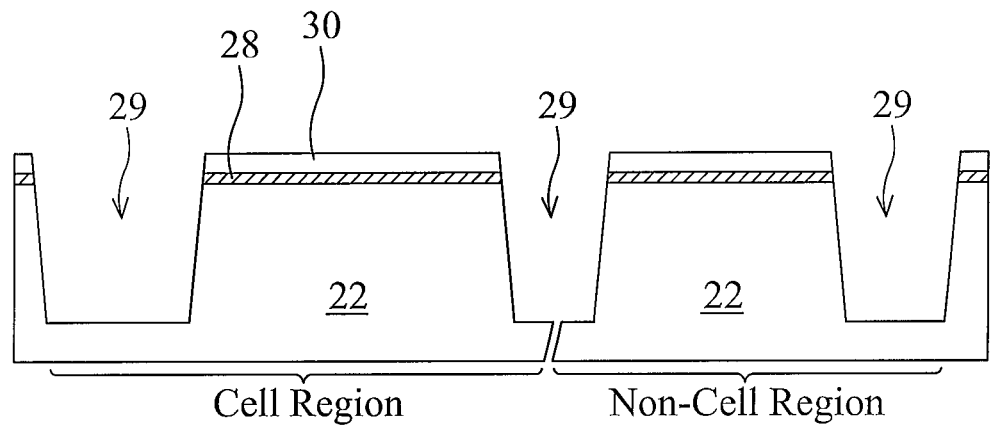

Referring to FIG. 3, trenches 29 are formed in substrate 22, preferably by anisotropic etching. In the cases wherein substrate 22 has an SOI structure, trenches 29 are preferably deep enough to reach the buried oxide layer, so that the subsequently formed devices are enclosed in dielectric materials, and thus the leakage current is reduced.

Figure 4:
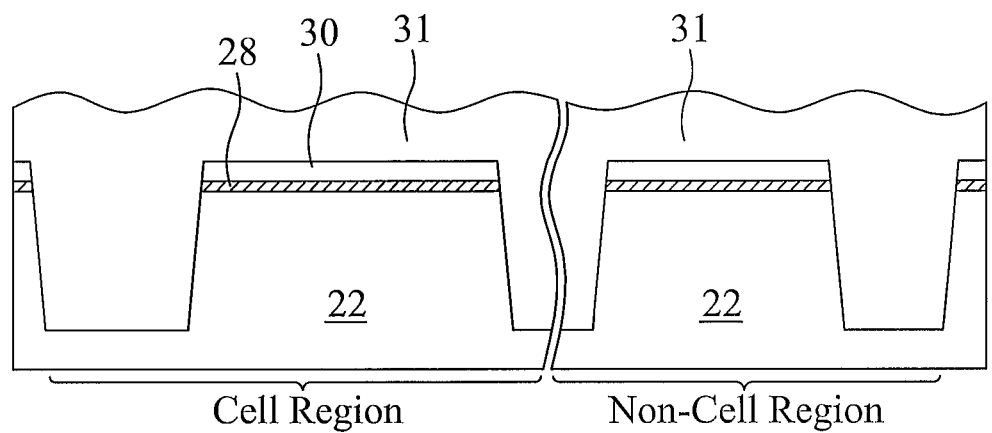
Figure 5:
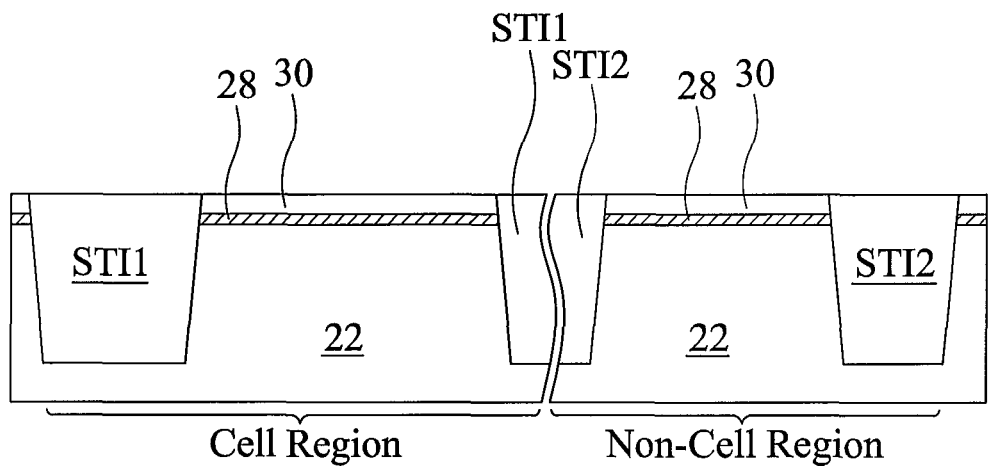

FIG. 4 illustrates trenches 29 filled with a dielectric material 31. Preferably, the filling material is silicon oxide formed by high-density plasma (HDP). Other materials such as silicon oxynitride may also be used. A chemical mechanical polish (CMP) is performed to remove excess dielectric material 31, thus a structure as shown in FIG. 5 is formed. The remaining portion of dielectric material 31 forms shallow trench isolation (STI) regions. In alternative embodiments, field oxide regions may be formed in the areas of the STI regions, for example, by local silicon oxidation processes.

For illustration purposes, the STI regions in the cell region and non-cell region are denoted as STI1 and STI2, respectively. STI regions STI1 isolate an active region, in which a flash memory cell may be formed, from the rest of the chip area. Similarly, STI regions STI2 isolate an active region, in which a non-memory MOS device is formed, from the rest of the chip area. STI regions STI1 and STI2 are also used for forming dummy devices, for the purpose of reducing microloading effects.

Figure 6:
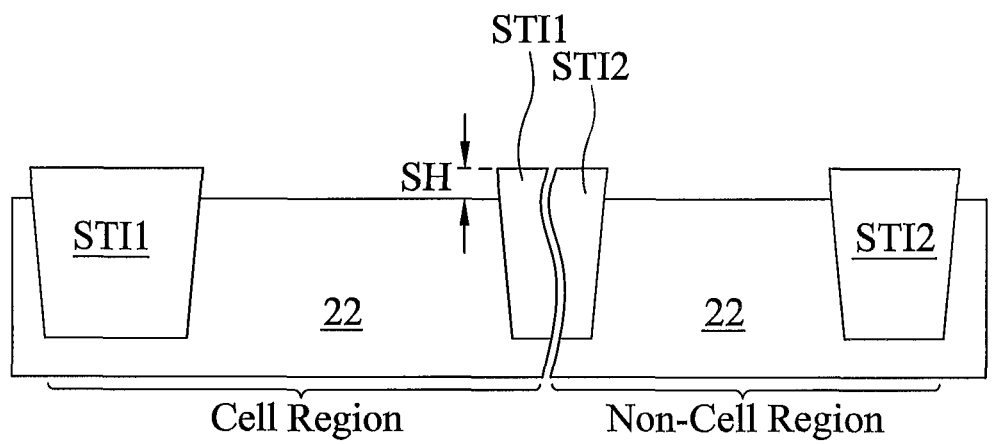

FIG. 6 illustrates a selective etch to remove mask layer 30 and pad layer 28. The surfaces of the resulting STI regions will thus be higher than the top surface of the exposed substrate 22, resulting in a step height SH.

Figure 7:
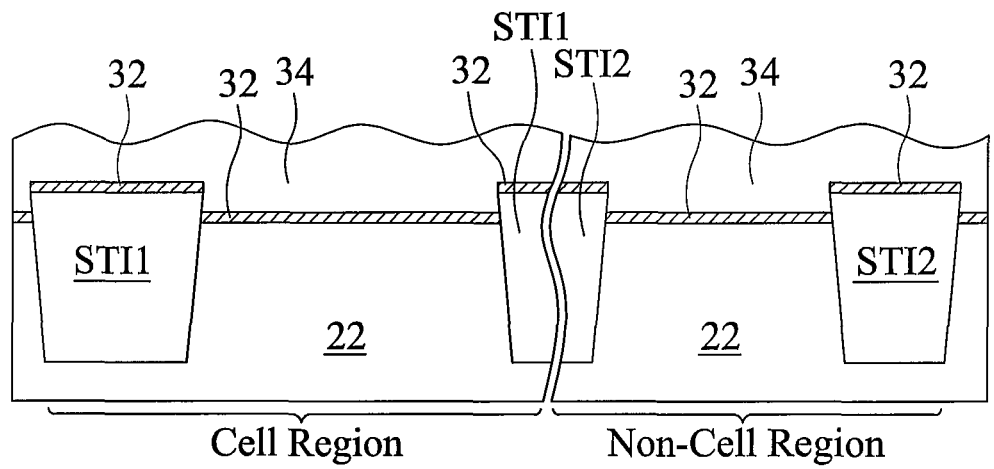

Referring to FIG. 7, a tunneling layer 32 and a floating gate layer 34 are formed. Tunneling layer 32 may be an oxide layer formed by any oxidation process, such as wet or dry thermal oxidation or in-situ steam generation (ISSG) process, in an ambient comprising $H_2O$, NO, or a combination thereof, or by chemical vapor deposition (CVD) techniques using tetraethyl-ortho-silicate (TEOS) and oxygen as a precursor. Tunneling layer 32 may also comprise high-k dielectric materials, such as $HfO_2$, silicon nitride, silicon oxynitride, and the like. In the preferred embodiment, tunneling layer 32 is less than about 200 Å in thickness. It should be appreciated, however, that the dimensions cited in the specification are merely examples, and these dimensions will change with the scaling of integrated circuits.

The floating gate layer 34, also sometimes referred to as storage layer 34, is formed on tunneling layer 32. In the preferred embodiment, floating gate layer 34 is a dielectric layer with a high trap density, which preferably includes nitrides. Charges are stored in the floating gate layer 34 around traps. Alternatively, floating gate layer 34 comprises conductive materials such as polysilicon, metals, metal silicides, metal nitrides, and the like.

Figure 8:
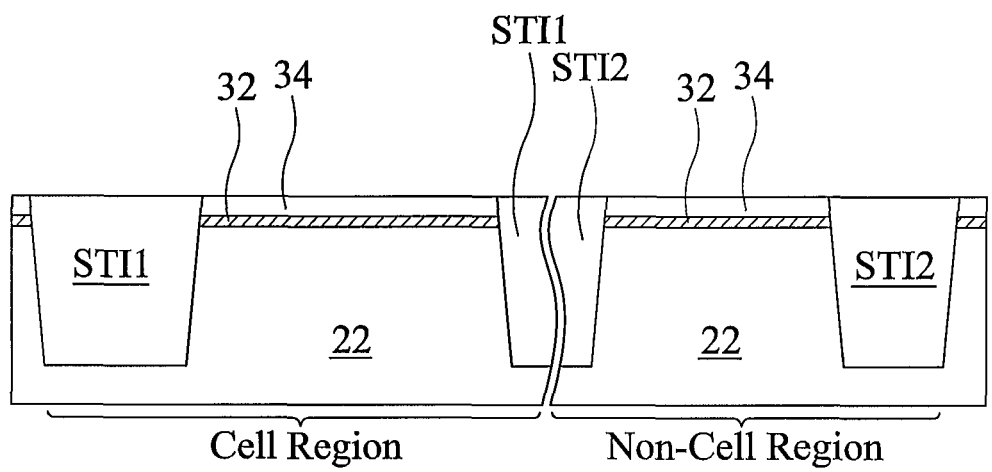

A CMP is then performed, excess materials are removed, and the resulting structure is shown in FIG. 8. The top surface of the floating gate layer 34 is substantially leveled with the top surface of STI regions STI1 and STI2. Obviously, the step height SH (refer to FIG. 6) defines the combined thickness of tunneling layer 32 and floating gate layer 34.

Figure 9A:
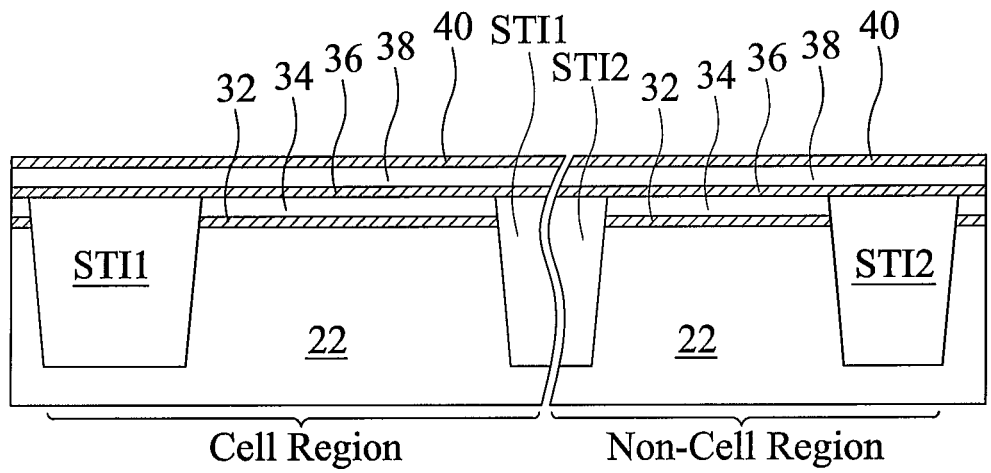

FIG. 9A illustrates the formation of a blocking layer 36 on floating gate layer 34, a control gate layer 38 on blocking layer 36 and a capping layer 40 on control gate layer 38. Blocking layer 36 preferably includes a low-leakage dielectric material, for example, $HfO_2$, although known dielectric materials such as silicon oxide can be used. Commonly used methods such as physical vapor deposition (PVD), atomic layer chemical vapor deposition (ALCVD), metal-organic CVD (MOCVD), and the like can be used in the formation process. The effective oxide thickness of blocking layer 36 is preferably less than about 170 Å. In the preferred embodiment, control gate layer 38 comprises doped polysilicon. In other embodiments, control gate layer 38 comprises metal silicides, conductive metal oxides, metals, or metal alloys. Similarly, the formation methods preferably include sputter and PVD. The capping layer 40 is a dielectric layer, and may be formed of commonly used dielectric materials such as oxides, nitrides, oxynitrides, and combinations thereof.

Figure 9B:
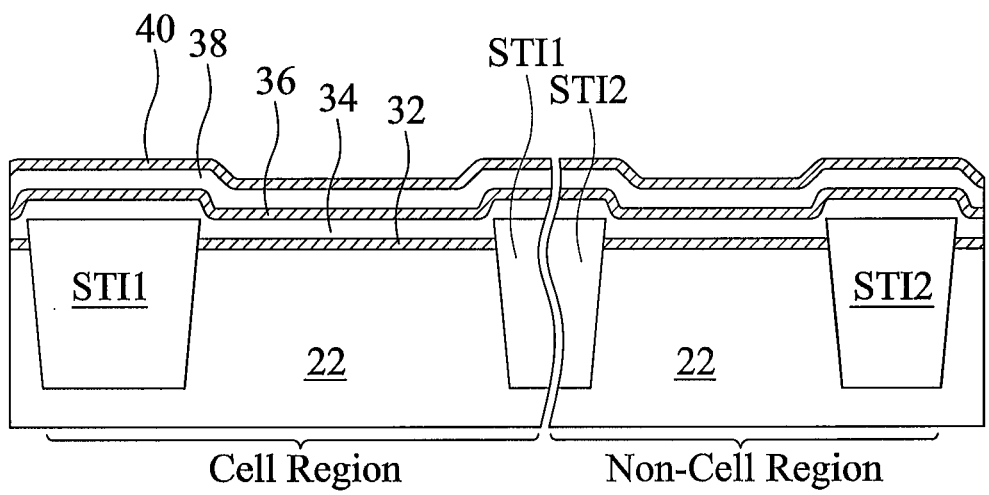

In a variation of the preferred embodiment, after the structure shown in FIG. 6 is formed, the stacked layers 32, 34, 36, 38 and 40 are formed consecutively (without the CMP step), and thus resulting in a structure as shown in FIG. 9B. It is realized that in this embodiment, the top surfaces of the floating gate layer 34 may be higher or lower than the top surface of the STI regions STI1 and STI2. The topography of the wafer will also be affected.

Figure 10:
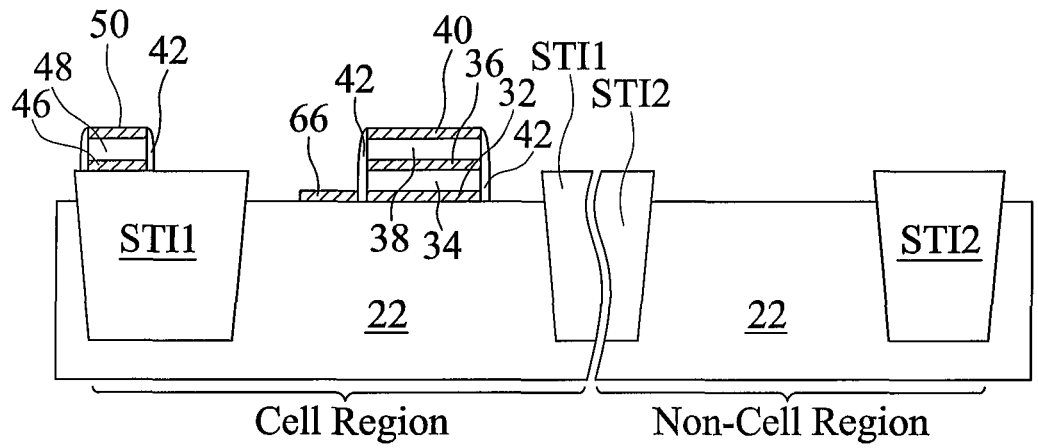

The stacked layers are then patterned. FIG. 10 illustrates a resulting structure after the patterning of the structure shown in FIG. 9A. In the cell region, the remaining stacked layers form a gate stack for a flash memory device, while in the non-cell region, the stacked layers are removed. In order to reduce micro-loading effects, the stacked layers on STI region STI1 are also patterned, forming a dummy pattern including layers 46, 48 and 50. Next, gate spacers 42 are formed on the sidewalls of the gate stacks. As is known in the art, gate spacers 42 can be formed using oxides, nitrides, oxynitrides, and/or other commonly used dielectric materials. Channel dielectric 66 is also formed.

Figure 11:
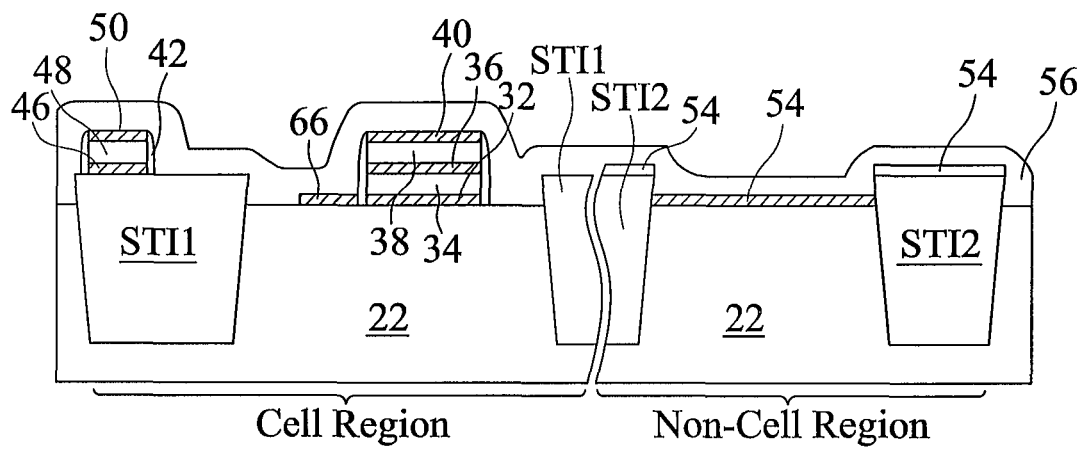

Referring to FIG. 11, a gate dielectric layer 54 is formed over the non-cell region, and a gate electrode layer 56 is blanket formed. As is known in the art, gate dielectric layer 54 may be formed of oxides, nitrides, oxynitrides, and preferably high-k dielectric materials. The thickness of the gate dielectric layer 54 is preferably less than about 200 Å. Gate electrode layer 56 is preferably formed of polysilicon. Alternatively, amorphous silicon, metal nitrides, metal silicides, and other commonly used conductive materials can be used.

Figure 12:
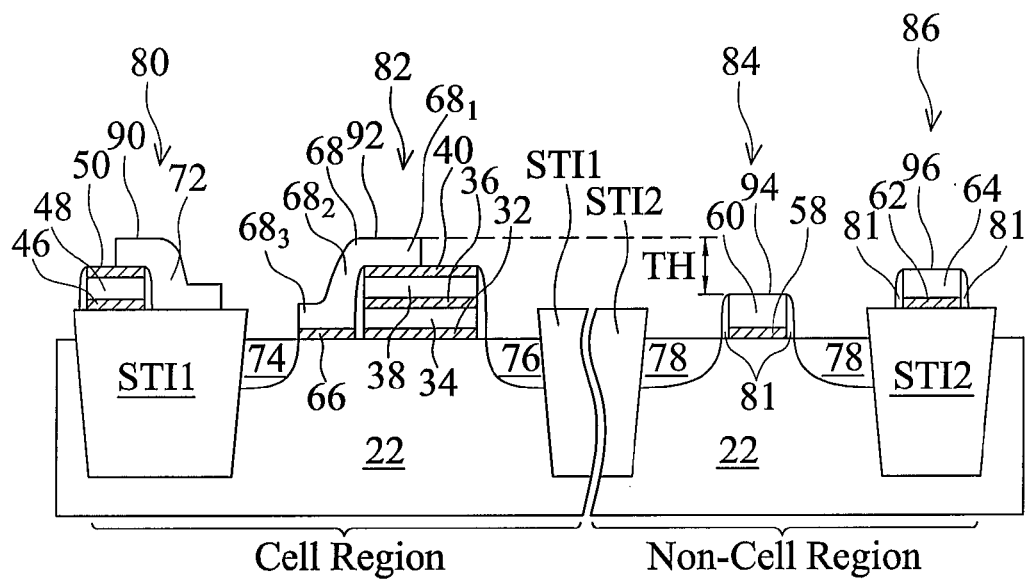

Gate electrode layer 56 and gate dielectric layer 54 are then patterned, as shown in FIG. 12. In the non-cell regions, a gate stack 84, including gate dielectric 58 and gate electrode 60, is formed. A dummy pattern 86, which includes dummy gate dielectric 62 and dummy gate 64, are formed on STI region STI2 in order to reduce micro-loading effects. In the cell region, wordline 68 is formed. Wordline 68 is also referred to as selection gate 68. A dummy pattern 80, which includes dummy gate 72, is formed on STI region STI1. Source region 76 and drain region 74 are formed for flash memory cell 82. Spacers 81 and source/drain regions 78 are formed adjacent to gate 84, forming a MOS device (also referred to as MOS device 84). The respective formation processes are well known in the art, thus are not discussed herein. As wordline 68, gate electrode 60, dummy gate 72 and dummy gate 64 are simultaneously formed, they have substantially equal thicknesses, the same materials and the same compositions. The top surface of the wordline 68 preferably has a distance less than about 2500 Å from substrate 22.

In the resulting structure, dummy pattern feature 80 has a top surface 90. Flash memory cell 82 has a top surface 92. MOS device 84 has a top surface 94. Dummy feature 86 has a top surface 96. The top surfaces 90, 92, 94 and 96 are very likely to be at different heights. The topography height differences, for example, the height difference TH between flash memory cell 82 and MOS device 84, may be significant enough to cause process-difficulty in the subsequent lithography processes, and even failures. Therefore, the topography height differences are preferably at least reduced, and more preferably eliminated.

Figure 13:
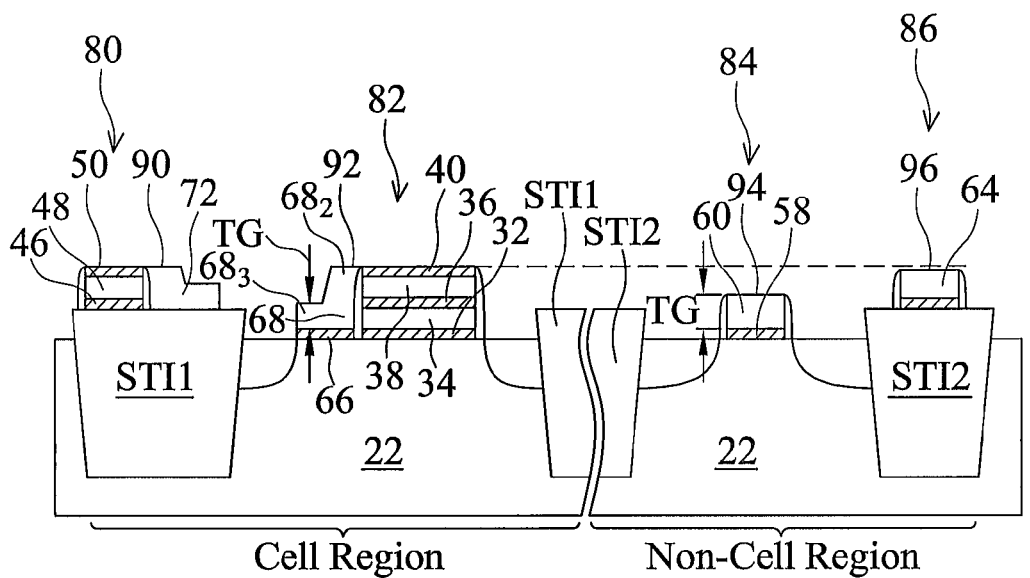
FIG. 13 illustrates the recession of a wordline of a flash memory cell, wherein the top portion over a gate stack is removed, while gate stacks in non-cell regions are not recessed.

Due to the height difference SH (refer to FIG. 6) and the variation in thicknesses of the stacked layers 32, 34, 36, 38 and 40, the top surface of the capping layer 40 in the cell region may be higher or lower than the top surface 94 of the gate electrode 60 (and/or the top surface 96 of dummy feature 86). This leads to several embodiments. In a first embodiment of the present invention, as is shown in FIG. 12, the top surface of the capping layer 40 is higher than the top surfaces 94 and 96. To reduce the height difference, a CMP is performed to recess the top surface 92 and/or the top surface 90. FIG. 13 illustrates that the top surfaces 90 and 92 are recessed (reduced) to the top surface of capping layer 40. Dummy gate 72 is also recessed simultaneously. As top surfaces 94 and 96 are lower than the top surface of capping layer 40, they are not recessed.

Figure 14:
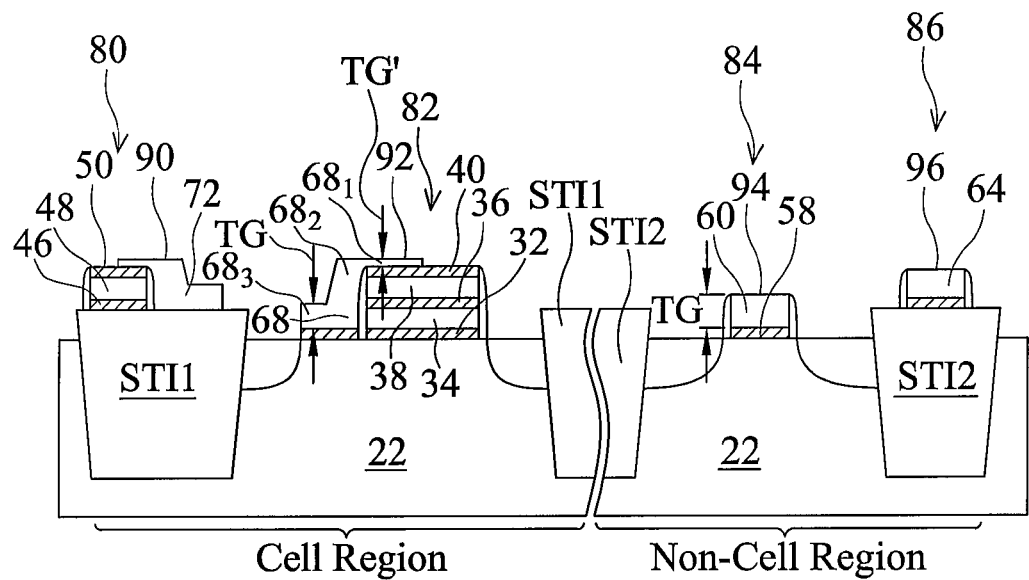
FIG. 14 illustrates the recession of a wordline of a flash memory cell, wherein the top portion over the gate stack is partially removed, while gate stacks in non-cell regions are not recessed.

It should be appreciated that the CMP or selective dry etching back may be stopped before the top surface of capping layer 40 is reached, and thus the top surfaces 90 and 92 will be higher than as shown in FIG. 13. FIG. 14 illustrates a resulting second embodiment of the present invention.

Wordline 68 preferably includes three portions, a higher portion 68₁, directly over the floating gate 34, a vertical portion 68₂, and a lower portion 68₃ over the channel region. Portions 68₁ and 68₃ may have substantially flat top surfaces. Before CMP, the portions 68₁ and 68₃ of the wordline 68 and gate electrode 60 all have a substantially equal thickness TG. After CMP, the thickness TG of the gate electrode 60 will be greater than the thickness TG' of the higher wordline portion 68₁. Also, the thickness TG of the portion 68₃ of the wordline 68 will be greater than the thickness TG' of the portion 68₁ of the wordline 68. In FIG. 13, the thickness TG' of the portion 68₁ is reduced to zero.

Figure 15:
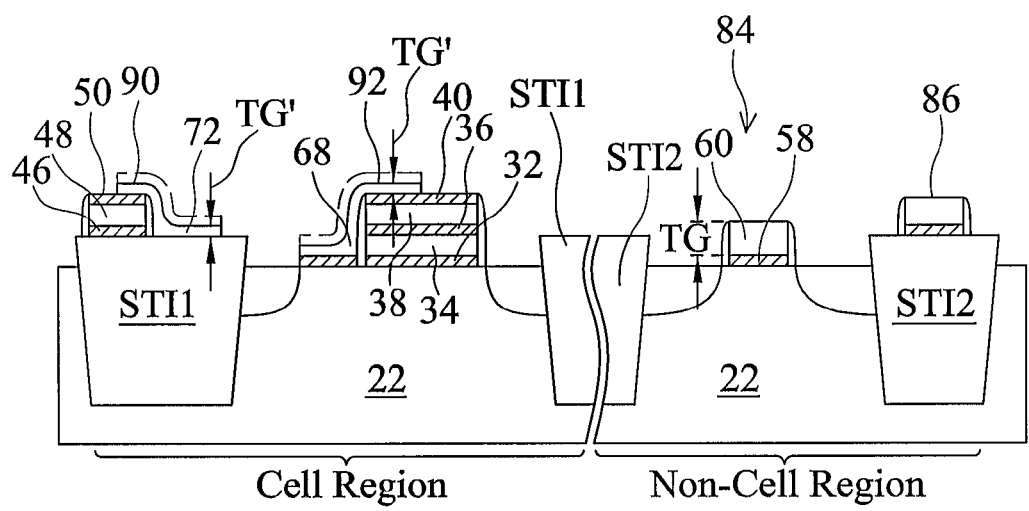
FIG. 15 illustrates the recession of a wordline of a flash memory cell by dry etch, while gate stacks in non-cell regions are not recessed.

In a third embodiment, dry etching is used to recess the top surfaces 90 and 92, as is shown in FIG. 15, wherein dashed lines indicate the original positions of features 68 and 72. The non-cell region is preferably protected during the dry etching. As a result, the thickness TG' of the wordline 68 and dummy pattern 72 are substantially equally reduced, and is less than the thickness TG of the gate electrode 60 in the non-cell region. Preferably, after the recession of the top surfaces 90 and 92, a combined thickness, which includes thickness TG' and the thicknesses of layers 34, 36, 38 and 40, is preferably less than about 150 percent of the thickness TG. Thicknesses TG and TG' preferably have a difference of less than about 1000 Å.

Figure 16:
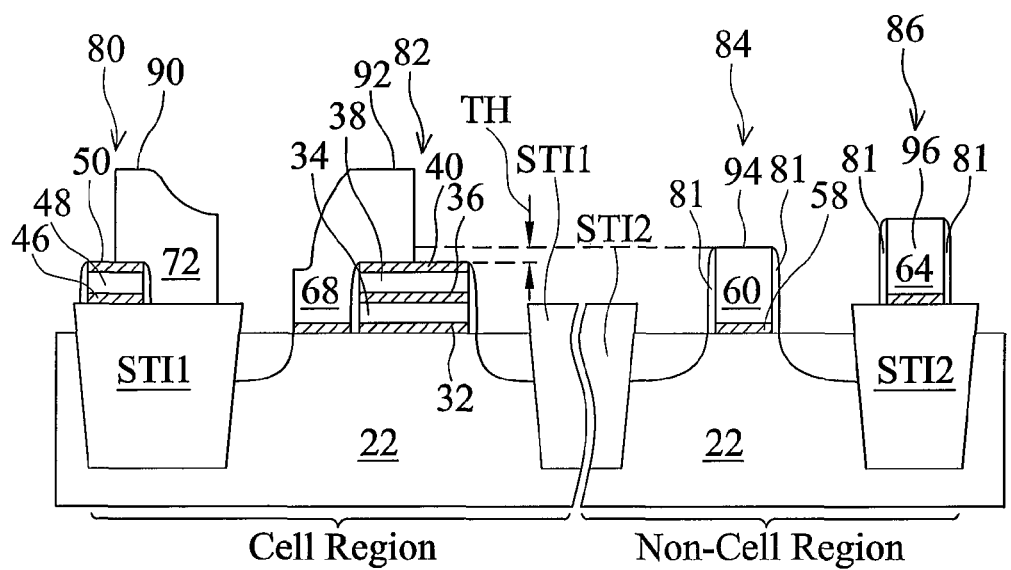
FIG. 16 illustrates a gate stack of a flash memory cell having a top surface lower than a top surface of a gate stack in a non-cell region.
Figure 17:
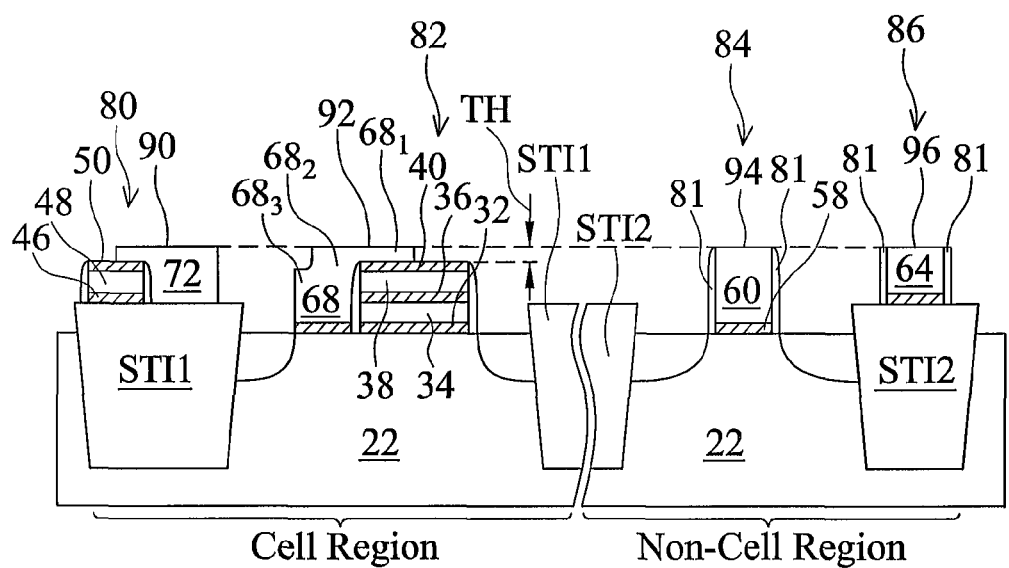
FIG. 17 illustrates the recession of a wordline shown in FIG. 16, wherein the top portion over a gate stack is leveled to a top surface of a gate stack in a non-cell region.

As has been discussed in preceding paragraphs, the top surface of the capping layer 40 may also be lower than the top surface 94 of the gate electrode 64 and/or the top surface 96 of the dummy pattern 86. FIG. 16 illustrates such as structure. It is thus possible to fully level the top surfaces 90, 92, 94 and 96. FIG. 17 illustrates a fourth embodiment of the present invention, wherein top surfaces 90, 92, 94 and 96 are all substantially leveled. A higher portion of the wordline 86, is not partially removed. In this embodiment, one of the gate electrode 60 and dummy gate 64, or both, may need to be polished, thus the respective thicknesses of the gate electrode 60 and dummy gate 64 are also reduced. To accurately control the recession amount, a protective oxide may be formed on one of the gate electrode 60 and/or dummy feature 64. The protective oxide may be used to prevent over-polishing.

Figure 18:
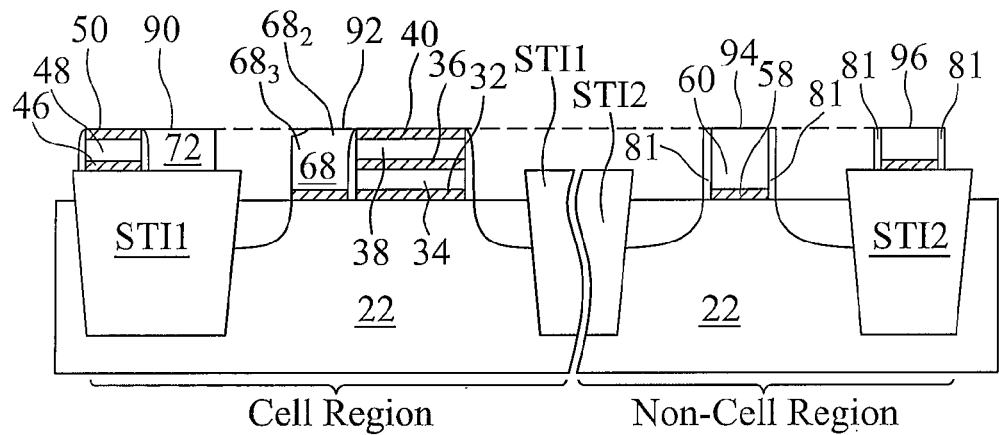
FIG. 18 illustrates the recession of a wordline in FIG. 16, wherein both gate stacks in the cell region and non-cell region are recessed, and all gate stacks have substantially leveled top surfaces.

In a fifth embodiment, as shown in FIG. 18, the CMP or selective dry etching back process stops when the capping layer 40 in the cell region is reached. The resulting top surfaces 90, 92, 94 and 96 are leveled. The higher portion 68, (refer to FIG. 16) of the wordline 68 is thus substantially removed, and a top surface of the vertical portion $68_2$ is leveled to the top surface of capping layer 40. In this embodiment, one of the gate electrode 60 and dummy gate 64, or both, may also need to be polished, thus the respective thickness is also reduced.

It should be realized that due to the multiple combinations of difference heights of the top surfaces of the various features discussed, there are more possible embodiments reflecting where the recession can stop. However, the concept of recessing at least one of the top surfaces of the gate stacks can be applied to form more evened surfaces.

Figure 19:
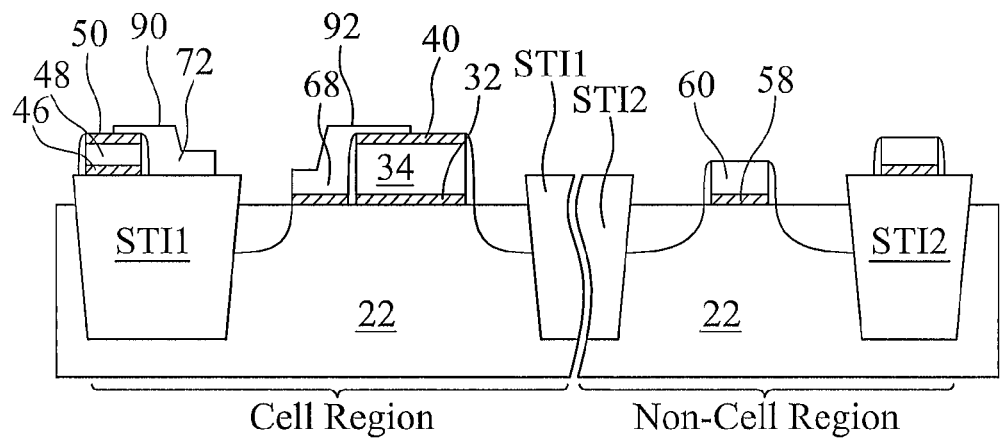
FIG. 19 illustrates the recession of a double-gate split-gate flash memory cell.

The previously discussed embodiments use tri-gate split-gate flash memory cells, which include floating gate 34, control gate 38 and selection gate (also referred to as wordline) 68, as examples. One skilled in the art will realize that the teaching also applies to double-gate split-gate flash memory cells, which has only the floating gate 34 and wordline 68. The structure and formation methods are similar to the previously discussed preferred embodiments, except that the control gate 38 and blocking oxide 36 are not formed. FIG. 19 illustrates an exemplary embodiment of a split-flash cell with two gates, a floating gate 34 and a wordline 68. Note that the wordline 68 in the cell region is recessed. The embodiment shown in FIG. 19 is a corresponding structure of the embodiment shown in FIG. 14. One skilled in the art will realize that the embodiments shown in FIGS. 15, 17 and 18 also have respective double-gate counterpart embodiments.

Figure 20:
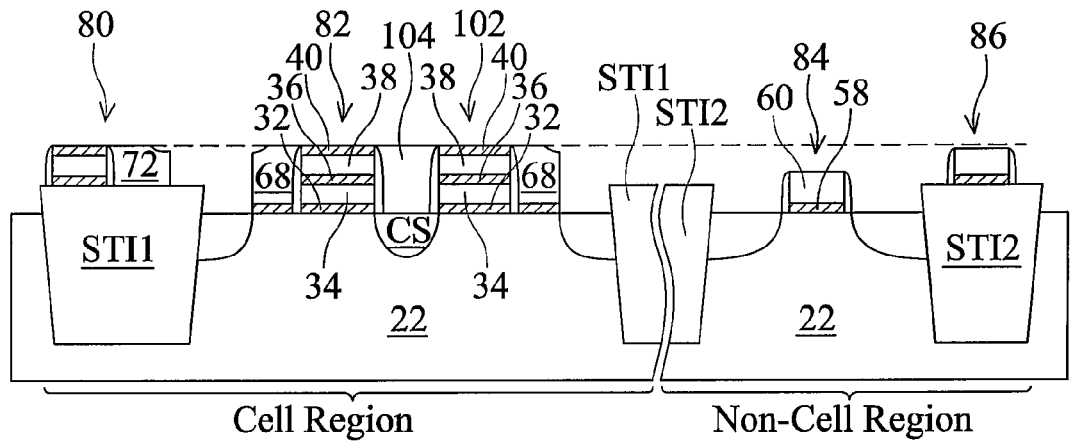
FIG. 20 illustrates the recession of wordlines simultaneously with a plug conductor.
Figure 21:
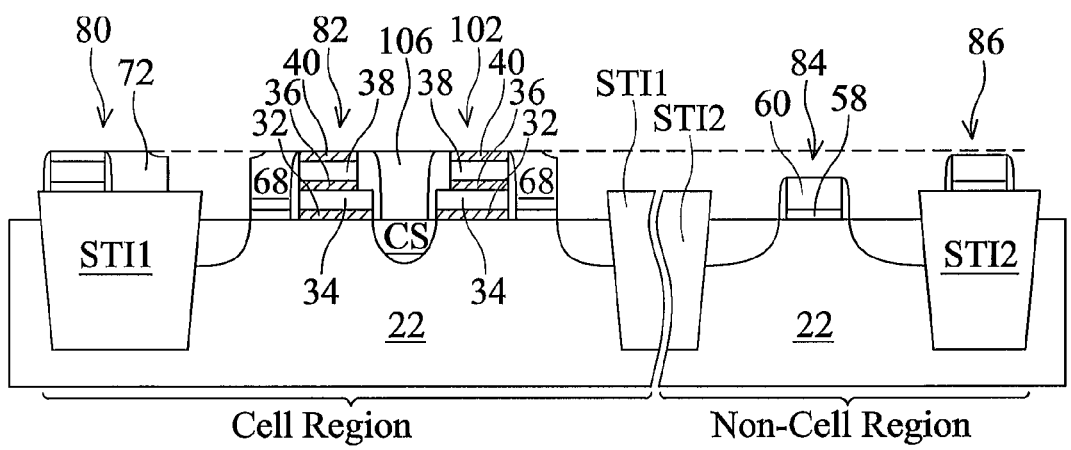
FIG. 21 illustrates the recession of wordlines simultaneously with an erase gate.

FIG. 20 illustrates an embodiment having a plug conductor 104, which is used for accessing a common source CS. As can be seen, wordlines 68 are polished simultaneously with plug conductor 104. FIG. 21 illustrates an embodiment slightly different from the embodiment shown in FIG. 21, wherein an erase gate 106 is formed. Note that the dielectric layers between floating gates 34 and erase gate 106 are thinner than the dielectric layers between control gates 38 and erase gate 106, and thus charges can be erased from floating gate to erase gate 106. One skilled in the art will realize the respective formation steps.

Furthermore, the concept of recessing top surfaces of flash memory cells in order to reduce topography height difference is readily available for the formation of other flash memory cells, for example, stacked gate memory cells, erase gate memory cells, and the like. For example, a control gate of a stacked gate memory cell can be recessed to a top surface of a peripheral MOS device. One skilled in the art will realize the respective process steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a substrate comprising a cell region and a non-cell region;
    a flash memory cell in the cell region, wherein the flash memory cell comprises a gate stack over the substrate, and a first gate over the substrate and comprising a vertical portion on a sidewall of the gate stack, the first gate being a selection gate;
    a metal-oxide-semiconductor (MOS) device in the non-cell region, wherein the MOS device comprises a second gate, with a top surface of the first gate and a top surface of the second gate substantially level with each other, wherein the first gate and the second gate are separate portions of a same patterned layer, and wherein any portion of the first gate directly over the gate stack of the flash memory cell has a first thickness less than a second thickness of the second gate; and
    a dummy gate over an insulation region in the substrate, wherein the dummy gate comprises same materials as the first and the second gates, and wherein the dummy gate has at least a top portion having a third thickness different from at least one of the first and the second thicknesses.

2. The semiconductor structure of claim 1, wherein a top surface of the first gate is higher than a top surface of the second gate.

3. The semiconductor structure of claim 1, wherein the gate stack of the flash memory cell comprises a tunneling layer on the substrate, and a floating gate on the tunneling layer, and wherein the first gate further comprises a lower portion on a channel dielectric, and wherein the channel dielectric is on the substrate.

4. The semiconductor structure of claim 3, wherein the gate stack of the flash memory cell further comprises a blocking layer on the floating gate, and a control gate on the blocking layer, and wherein the first gate does not comprise any portion directly over the gate stack of the flash memory cell.

5. The semiconductor structure of claim 3, wherein the first gate is a portion of a wordline of a memory array, and wherein a top surface of the vertical portion of the first gate is substantially level with a top surface of the gate stack.

6. The semiconductor structure of claim 3, wherein the first gate further comprises a top portion directly over the floating gate.

7. The semiconductor structure of claim 1, wherein a difference between the first thickness and the second thickness is less than about 1000 Å.

8. The semiconductor structure of claim 1, wherein a top surface of the first gate has a vertical distance of less than about 2500 Å from a top surface of the substrate.

9. The semiconductor structure of claim 1 further comprising a plug conductor on an opposite side of the gate stack than the vertical portion of the first gate.

10. The semiconductor structure of claim 1 further comprising an erase gate on an opposite side of the gate stack than the vertical portion of the first gate.

11. A semiconductor structure comprising:
    a substrate comprising a cell region and a non-cell region;
    a flash memory cell in the cell region, wherein the flash memory cell comprises a gate stack over the substrate, and a first gate adjacent the gate stack, the first gate being a selection gate;

a first dummy feature in the cell region and over a first insulation region in the substrate, wherein the first dummy feature comprises a first dummy gate;

a MOS device in the non-cell region, wherein the MOS device comprises a second gate;

a second dummy feature in the non-cell region and over a second insulation region in the substrate, wherein the second dummy feature comprises a second dummy gate;

wherein the first gate, the second gate, the first dummy gate and the second dummy gate comprise substantially same materials; and wherein at least one of the first gate and first dummy gate has at least a top portion having a thickness less than a thickness of the second gate, wherein the top portion of the at least one of the first gate and first dummy gate is directly over the first gate and the first dummy gate, respectively.

12. The semiconductor structure of claim 11, wherein at least two of the first gate, the first dummy gate, the second gate and the second dummy gate have substantially level top surfaces.

13. The semiconductor structure of claim 11, wherein all of the first gate, the first dummy gate, the second gate and the second dummy gate have substantially level top surfaces.

14. The semiconductor structure of claim 11, wherein at least one of the first gate and first dummy gate has a top surface substantially level with a top surface of a capping layer at a top surface of the gate stack.

15. The semiconductor structure of claim 11, wherein the flash memory cell is a tri-gate flash cell, and wherein the flash memory cell further comprises a floating gate over the substrate and a control gate over the floating gate, and wherein the selection gate has at least a first portion along sidewalls of the floating gate and the control gate.

16. The semiconductor structure of claim 15, wherein the selection gate further comprises a second portion over the floating gate and the control gate, and wherein a top surface of the selection gate and a bottom surface of the floating gate have a vertical distance, and wherein the vertical distance is less than about 150 percent of a thickness of the second gate.

17. The semiconductor structure of claim 11, wherein the flash memory cell is a double-gate flash cell, and wherein the flash memory cell further comprises a floating gate over the substrate, and wherein the selection gate has at least a portion along a sidewall of the floating gate.

18. The semiconductor structure of claim 11, wherein the first gate comprises a vertical portion adjacent a sidewall of the gate stack of the flash memory cell and a horizontal portion on a channel dielectric, wherein the first gate comprises no portion directly over the gate stack of the flash memory cell, and wherein the channel dielectric is on the substrate.

19. The semiconductor structure of claim 11, wherein the first gate comprises a higher portion over the gate stack of the flash memory cell, a vertical portion adjacent the gate stack, and a lower portion on a channel dielectric, and wherein the channel dielectric is on the substrate.

20. A semiconductor structure comprising:

a substrate comprising a cell region and a non-cell region;

a flash memory cell in the cell region, wherein the flash memory cell comprises a gate stack over the substrate, and a first gate over the substrate and comprising a vertical portion on a sidewall of the gate stack, the first gate being a selection gate;

a metal-oxide-semiconductor (MOS) device in the non-cell region, wherein the MOS device comprises a second gate, wherein the first gate and the second gate are separate portions of a same patterned layer, and wherein any portion of the first gate directly over the gate stack of the flash memory cell has a first thickness less than a second thickness of the second gate; and a dummy gate over an insulation region in the substrate, wherein the dummy gate comprises same materials as the first and the second gates, and wherein the dummy gate has at least a top portion having a third thickness different from at least one of the first and the second thicknesses.

* * * * *